United States Patent
Lee et al.

[11] Patent Number: 6,160,314
[45] Date of Patent: *Dec. 12, 2000

[54] POLISHING STOP STRUCTURE

[75] Inventors: Tzung-Han Lee, Taipei; Li-Chieh Chao, Taoyuan Hsien, both of Taiwan

[73] Assignee: United Microelectronics Corp., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/073,157

[22] Filed: May 5, 1998

[30] Foreign Application Priority Data

Mar. 17, 1998 [TW] Taiwan .................................. 87103893

[51] Int. Cl.⁷ .......................... H01L 21/28; H01L 21/304
[52] U.S. Cl. ........................... 257/752; 438/633; 438/691
[58] Field of Search .................................. 257/752, 760; 438/633, 634, 691

[56] References Cited

U.S. PATENT DOCUMENTS

| | | | |
|---|---|---|---|
| 4,789,648 | 12/1988 | Chow et al. | 438/633 |
| 5,578,523 | 11/1996 | Fiordalice et al. | 438/633 |
| 5,592,024 | 1/1997 | Aoyama et al. | 257/752 |
| 5,741,626 | 4/1998 | Jain et al. | 430/314 |
| 5,891,799 | 4/1999 | Tsui | 438/624 |
| 5,926,732 | 7/1999 | Matsuura | 438/622 |

*Primary Examiner*—Donald L. Monin, Jr.
*Attorney, Agent, or Firm*—Merchant & Gould P.C.

[57] ABSTRACT

A polishing stop structure has a polishing stop layer formed in the dielectric layer. When a chemical mechanical polishing is performed on a bumpy surface of this structure, the lower regions of the surface are first to expose the polishing stop layer, is not easily removed. While polishing stops at the lower regions, the higher regions continue to be polished. The structure can control the polishing level to increase the window of over-etching and attain a smoother surface.

18 Claims, 4 Drawing Sheets

POLISHING STOP STRUCTURE

CROSS-REFERENCE TO RELATED APPLICATION

This application claims the priority benefit of Taiwan application serial no. 87103893, filed Mar. 17, 1998, the full disclosure of which is incorporated herein by reference.

BACKGROUND OF THE INVENTION

1. Field of the Invention

The invention relates in general to a planarization process of chemical mechanical polishing (CMP), and more particularly to a planarization process of depositing materials with various polishing rates to achieve the best planarization.

2. Description of the Related Art

Surface planarization is an important technique dealing with high density photolithography in the field of semiconductor processes. A smooth surface having no relief can avoid scattering during exposure and achieve accurate pattern transfer. Planarization techniques comprise spin-on glass (SOG) and chemical mechanical polishing (CMP). The requirements for flatness of the sub-half-micro technique in semiconductor fabrication cannot be met by SOG. CMP is the only technique able to provide global planarization on the very large scale integration (VLSI) even on the ultra large scale integration (ULSI).

Basically, CMP uses the principle of mechanical polishing and an apposite chemical promoter to polish a bumpy surface. FIG. 1A is a top view of a conventional apparatus for chemical mechanical polishing. FIG. 1B is a cross-sectional view of the conventional apparatus for chemical mechanical polishing. The conventional apparatus for chemical mechanical polishing comprises a polishing table 10, a holder 11 which is used to hold a chip 12, a polishing pad 13 on the polishing table 10, a service pipe 14 which is used to transport slurry 19 to the polishing pad 13 and a pump 15 which is used to carry a slurry 19 into the service pipe 14. The polishing table 10 and the holder 11 rotate variously along particular directions 18a and 18b as shown in FIG. 1A and FIG. 1B. The holder 11 holds the back 16 of the chip 12 and puts the front 17 of the chip 12 on the polishing pad 13. The service pipe 14 continually transports the slurry 19 distilled from the pump 15 to the polishing pad 13. The process of chemical mechanical polishing uses a chemical promoter from the slurry 19 to make a chemical reaction on the front 17 of the chip 12. The chemical reaction forms a polishing layer that is easy polished. Then, while the chip 12 sits on the polishing pad 13, mechanical polishing is performed on the chip 12 to remove the overhang of the easily polished polishing layer, using abrasive particles in the slurry 19. A planar surface is formed by repeating the chemical reactive step and the mechanical polishing step. FIG. 1c and FIG. 1D are cross-sectional views of the conventional process of chemical mechanical polishing as used to form a dielectric layer on a conductor section. Referring to FIG. 1C, a semiconductor substrate 110 has a conductive section 120. A thick dielectric layer 130 is deposited on the semiconductor substrate 110. Deposition of the thick dielectric layer 130 creates a difference in height between region 131, located above the conductive region 120, and region 132, located above the semiconductor 110. This results in a step between region 131 and region 132. The material of the thick dielectric layer 130 is, for example, silicon dioxide. A metal CMP step is performed to polish the thick dielectric layer 130. Theoretically, the region 131 above the conductive section 120 and the region 132 above the semiconductor substrate 110 are polished to a flat surface. However, since the high section of the step and the low section of the step both suffer chemical etching by the slurry, the surface of the dielectric layer 130 is uneven as shown in FIG. 1D.

SUMMARY OF THE INVENTION

It is therefore the object of the invention to provide a polishing stop structure. The polishing stop structure resolves the uneven surface formed by a conventional CMP process as described above and decreases the salience of the step.

The invention achieves the above-identified objects by providing a polishing stop structure. A polishing stop layer is added into a dielectric layer. When CMP is performed on a bumpy surface, the lower sections of the bumpy surface are the first to expose the polishing stop layer, whereupon CMP halts in those areas. CMP still continues on the higher sections of the bumpy surface to form a smoother surface. The polishing stop layer can control the polishing level and increase the window of over-etching.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
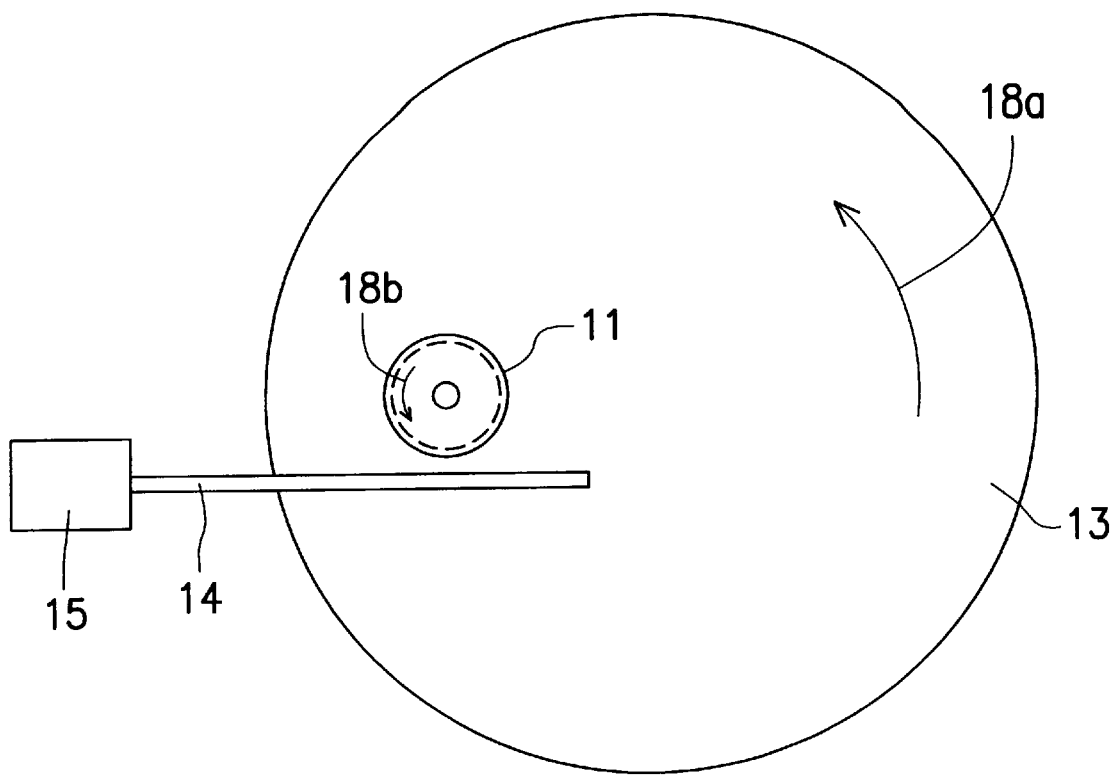
FIG. 1A is a top view showing a conventional apparatus for chemical mechanical polishing.
Figure 1B:
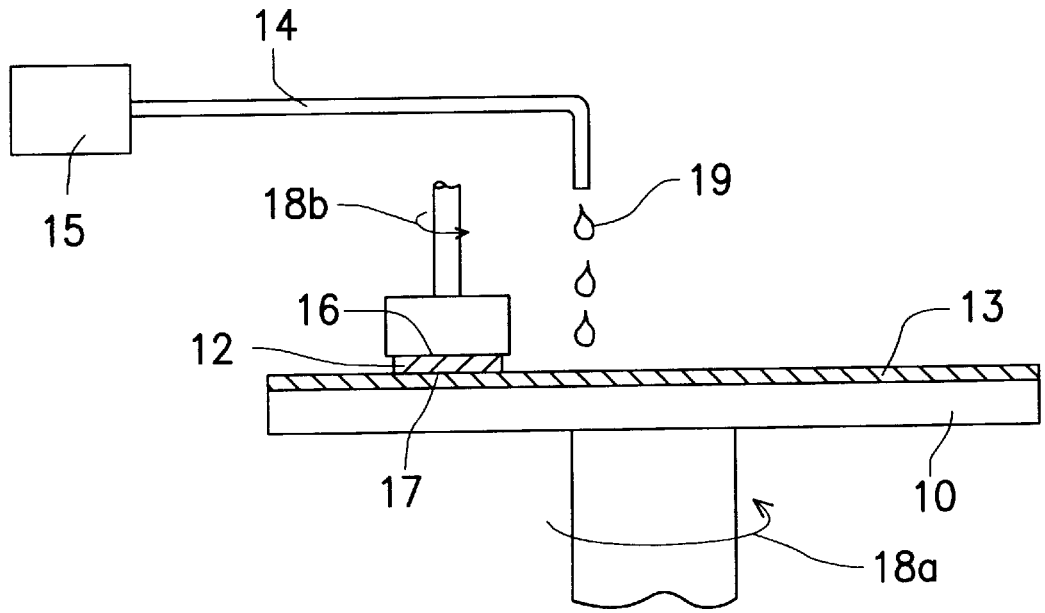
FIG. 1B is a cross-sectional view showing the conventional apparatus for chemical mechanical polishing.
Figure 1C:
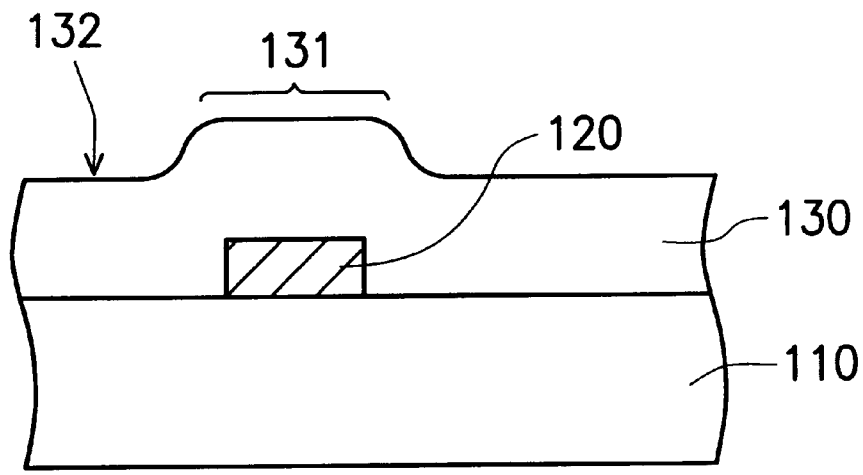
FIG. 1c and FIG. 1D are cross-sectional views showing the conventional process of chemical mechanical polishing to form a dielectric layer on a conductor section.
Figure 1D:
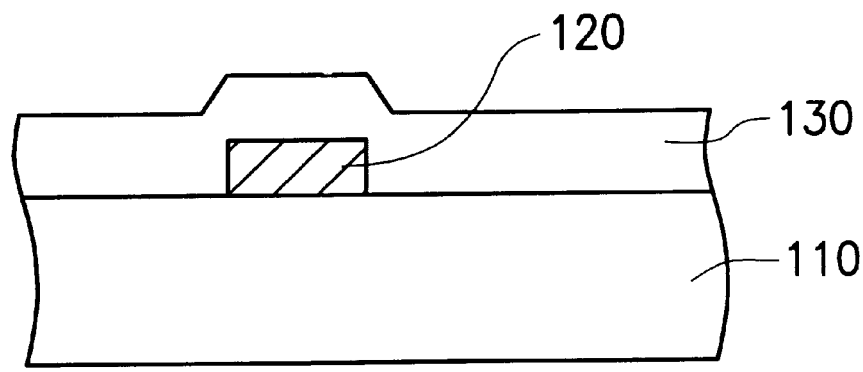
Figure 2A:
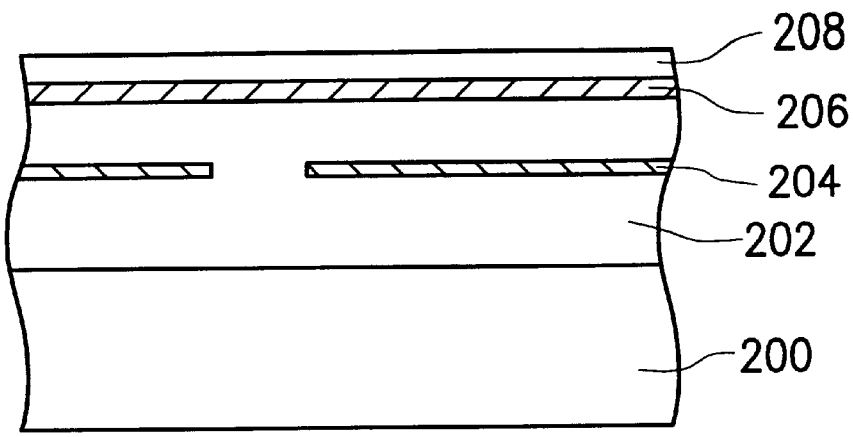
FIGS. 2A to 2C are cross-sectional views showing the process steps of one preferred embodiment of the polishing stop layer.
Figure 2B:
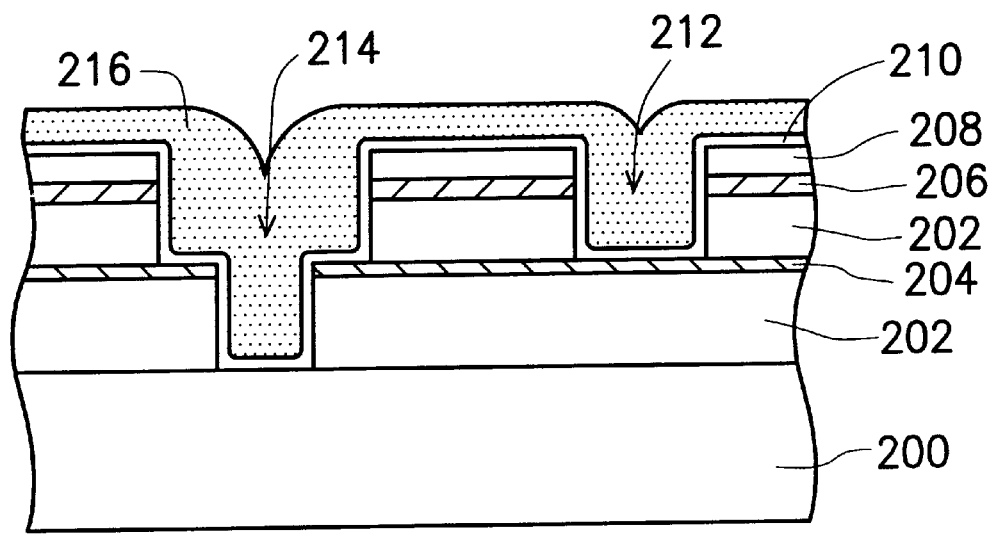
Figure 2C:
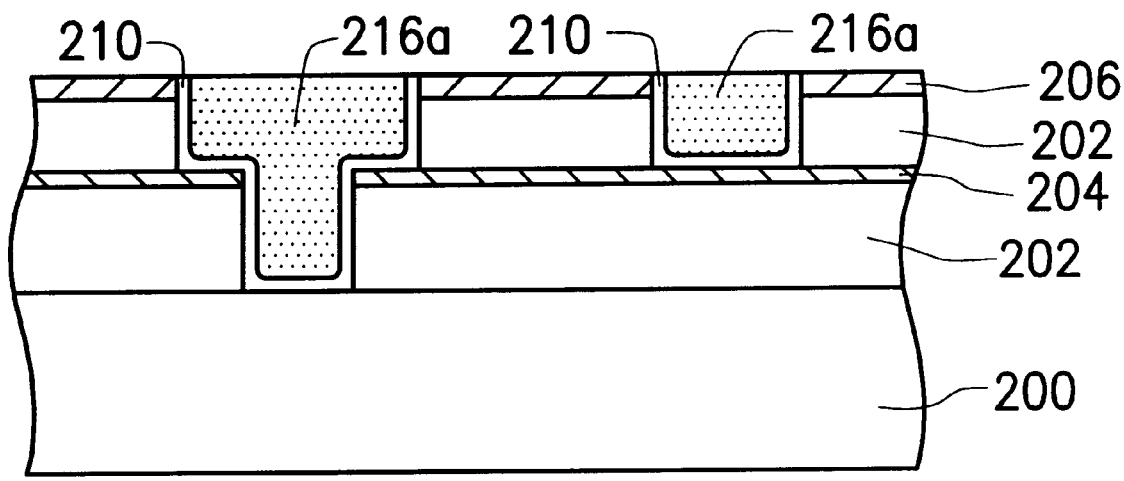

FIGS. 2A to 2C are cross-sectional views showing the process steps of one preferred embodiment of the polishing stop layer.

Referring first to FIG. 2A, a first dielectric layer 202 is formed on a semiconductor substrate 200. The dielectric layer 202, for example, is a silicon dioxide layer. An etching stop layer 204, for example, a silicon nitride layer, is formed in the dielectric layer 202. The materials of the polishing stop layer 206 and the dielectric layer 202 are different. A polishing stop layer 206 is formed on the dielectric layer 202. The material of the polishing stop layer 206 is, for example, silicon-oxy-nitride, silicon nitride or aluminum oxide, which are not easily removed by CMP and have a high polishing selectivity. The dielectric layer 202 is therefore more easily removed by chemical mechanical polishing than the polishing stop layer 206. A second dielectric layer 208 is formed on the polishing stop layer 206. The material of the second dielectric layer is different from the polishing stop layer 206, for example, silicon dioxide.

Referring to FIG. 2B, a photolithography and etching step is performed to partially remove the first dielectric layer 202, the polishing stop layer 206 and the second dielectric layer 208. This step forms a trench 212 or a via 214 coupling with the semiconductor substrate 200. A thin glue layer 210 is formed on the stacked structure described in the foregoing steps. Further, the trench 212 and the via 214 are filled with a conductive material 216.

Referring to FIG. 2C, a CMP step is performed to removed the conductive material 216 lying outside the trench 212 and the via 214. This step forms a conductive structure 216a in the trench 212 and the via 214.

The structure showed in the FIG. 2B has a bumpy surface. When the CMP step is performed, the higher region and the lower region of the surface are suffer chemical etching from the slurry at the same time. This invention uses a polishing stop layer that has a good resistance to CMP. The polishing stop layer can prevent the lower region of the surface from continual polishing.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A polishing stop structure, comprising:
   a semiconductor substrate;
   a single dielectric layer on the semiconductor substrate;
   a single etching stop layer formed within the dielectric layer which substantially separates the dielectric layer into a top portion and a bottom portion;
   a polishing stop layer on and adjacent to the top portion of the dielectric layer, wherein the polishing stop layer is not easily removed by chemical mechanical polishing; and
   a conductive layer formed through the polishing stop layer, the dielectric layer and the etching stop layer.

2. A structure according to claim 1, wherein the dielectric layer is a silicon dioxide layer.

3. A structure according to claim 1, wherein the etching stop layer is a silicon nitride layer.

4. A structure according to claim 1, wherein the polishing stop layer is a silicon-oxy-nitride layer.

5. A structure according to claim 1, wherein the polishing stop layer is a silicon nitride layer.

6. A structure according to claim 1, wherein the polishing stop layer is an aluminum oxide layer.

7. A polishing stop structure, comprising:
   a semiconductor substrate;
   a single first dielectric layer on the semiconductor substrate;
   a single etching stop layer formed within the first dielectric layer which substantially separates the first dielectric layer into a top portion and a bottom portion;
   a polishing stop layer on and adjacent to the top portion of the first dielectric layer, wherein the polishing stop layer is not easily removed by chemical mechanical polishing; and
   a second dielectric layer on the polishing stop layer.

8. A structure according to claim 7, wherein the first dielectric layer is a silicon dioxide layer.

9. A structure according to claim 7, wherein the second dielectric layer is a silicon dioxide layer.

10. A structure according to claim 7, wherein the etching stop layer is a silicon nitride layer.

11. A structure according to claim 7, wherein the polishing stop layer is a silicon-oxy-nitride layer.

12. A structure according to claim 7, wherein the polishing stop layer is a silicon nitride layer.

13. A structure according to claim 7, wherein the polishing stop layer is an aluminum oxide layer.

14. A polishing stop structure, comprising:
    a semiconductor substrate;
    a single first dielectric layer on the semiconductor substrate;
    a single etching stop layer formed within the first dielectric layer which substantially separates the first dielectric layer into a top portion and a bottom portion;
    a polishing stop layer on and adjacent to the top portion of the first dielectric layer, wherein the materials of the polishing stop layer and the first dielectric layer are different, and the first dielectric layer is more easily removed by chemical mechanical polishing than the polishing stop layer;
    a second dielectric layer on the polishing stop layer, wherein the materials of the second dielectric layer and the polishing stop layer are different; and
    a conductive layer formed through the polishing stop layer, the dielectric layer and the etching stop layer.

15. A polishing stop structure according to claim 14, wherein the first dielectric layer is a silicon dioxide layer.

16. A polishing stop structure according to claim 14, wherein the second dielectric layer is a silicon dioxide layer.

17. A polishing stop structure according to claim 14, wherein the polishing stop layer is a silicon-oxy-nitride layer.

18. A polishing stop structure according to claim 14, wherein the polishing stop layer is an aluminum oxide layer.

* * * * *